United States Patent
Lee et al.

(10) Patent No.: US 10,158,373 B2
(45) Date of Patent: Dec. 18, 2018

(54) REFERENCE DISTURBANCE MITIGATION IN SUCCESSIVE APPROXIMATION REGISTER ANALOG TO DIGITAL CONVERTER

(71) Applicant: Avnera Corporation, Beaverton, OR (US)

(72) Inventors: Wai Lee, Portland, OR (US); Jianping Wen, Tigard, OR (US); Garry N. Link, Pacific City, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/849,234

(22) Filed: Dec. 20, 2017

(65) Prior Publication Data
US 2018/0183457 A1    Jun. 28, 2018

Related U.S. Application Data

(60) Provisional application No. 62/438,927, filed on Dec. 23, 2016.

(51) Int. Cl.
*H03M 1/12* (2006.01)
*H03M 1/46* (2006.01)
(Continued)

(52) U.S. Cl.
CPC ......... *H03M 1/462* (2013.01); *H03M 1/0678* (2013.01); *H03M 1/08* (2013.01);
(Continued)

(58) Field of Classification Search
CPC ........ H03M 1/462; H03M 1/08; H03M 1/442; H03M 1/1009
(Continued)

(56) References Cited

U.S. PATENT DOCUMENTS

| 6,094,155 A | 7/2000 | Fees et al. |
| 6,864,821 B2 * | 3/2005 | Yang ..................... H03M 1/682 |
| | | 341/155 |

(Continued)

FOREIGN PATENT DOCUMENTS

| CN | 104917526 A | 9/2015 |
| TW | I511467 B | 12/2015 |
| TW | 201614961 B | 4/2016 |

OTHER PUBLICATIONS

International Search Report and Written Opinion issued in International Application No. PCT/US2017/067724, dated Mar. 14, 2018, 13 pages.

(Continued)

*Primary Examiner* — Khai M Nguyen
(74) *Attorney, Agent, or Firm* — Miller Nash Graham & Dunn LLP

(57) ABSTRACT

The disclosure includes a mechanism for mitigating charge related disturbances in a Successive Approximation Register (SAR) Analog to Digital Converter (ADC) by providing a fine reference connection and a rough reference connection. A switch array is activated to couple a current bit capacitor of a capacitor array to the rough reference connection while a current bit corresponding to the current bit capacitor is determined by a comparator. The switch array is further activated to couple a previous bit capacitor of the capacitor array to the fine reference connection while the current bit capacitor is coupled to the rough reference connection. This separates charge flow on the rough reference connection from capacitors coupled to the fine reference connection.

20 Claims, 6 Drawing Sheets

(51) Int. Cl.
*H03M 1/08* (2006.01)
*H03M 1/44* (2006.01)
*H03M 1/06* (2006.01)
(52) U.S. Cl.
CPC ......... *H03M 1/0863* (2013.01); *H03M 1/442* (2013.01); *H03M 1/468* (2013.01)
(58) Field of Classification Search
USPC .......................................... 341/161–163, 172
See application file for complete search history.

(56) References Cited

U.S. PATENT DOCUMENTS

| | | | |
|---|---|---|---|
| 6,958,722 B1 | 10/2005 | Janakiram et al. | |
| 8,258,991 B2 * | 9/2012 | Janakiraman | H03K 5/2481 |
| | | | 341/120 |
| 8,456,347 B2 * | 6/2013 | Wikner | H03M 1/1023 |
| | | | 341/118 |
| 8,599,059 B1 | 12/2013 | Chung et al. | |
| 9,148,159 B1 * | 9/2015 | Sharma | H03M 1/0678 |
| 9,413,374 B2 | 8/2016 | Lin | |
| 2016/0020778 A1 | 1/2016 | Bogner et al. | |

OTHER PUBLICATIONS

Taiwan IPO Search Report issued in Taiwan Patent Application No. 106145266, dated Oct. 5, 2018, 2 pages.

\* cited by examiner

REFERENCE DISTURBANCE MITIGATION IN SUCCESSIVE APPROXIMATION REGISTER ANALOG TO DIGITAL CONVERTER

CROSS-REFERENCES TO RELATED APPLICATIONS

The present application claims benefit from U.S. Provisional Patent Application Ser. No. 62/438,927, filed Dec. 23, 2016, and entitled "Mitigation Of Reference Disturbances," which is incorporated herein by reference as if reproduced in its entirety.

BACKGROUND

Analog to Digital Converters (ADCs) are employed in many technological areas. For example, an ADC may be employed to convert sound entering a microphone into a digital signal that can be stored and processed by a digital computing system. Certain ADCs employ capacitors to sample an analog signal. The ADC then converts the sample into a corresponding digital value. The activation of switches and the movement of charge across a capacitor may result in electrical noise across corresponding connections. When multiple capacitors share electrical connections, the electrical noise caused by measuring a first capacitor can alter measurements of a subsequently measured capacitor. Such electrical disturbances may limit the operational speed of the ADC, as each capacitor is delayed to await dissipation of electrical disturbances caused by previous capacitors.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
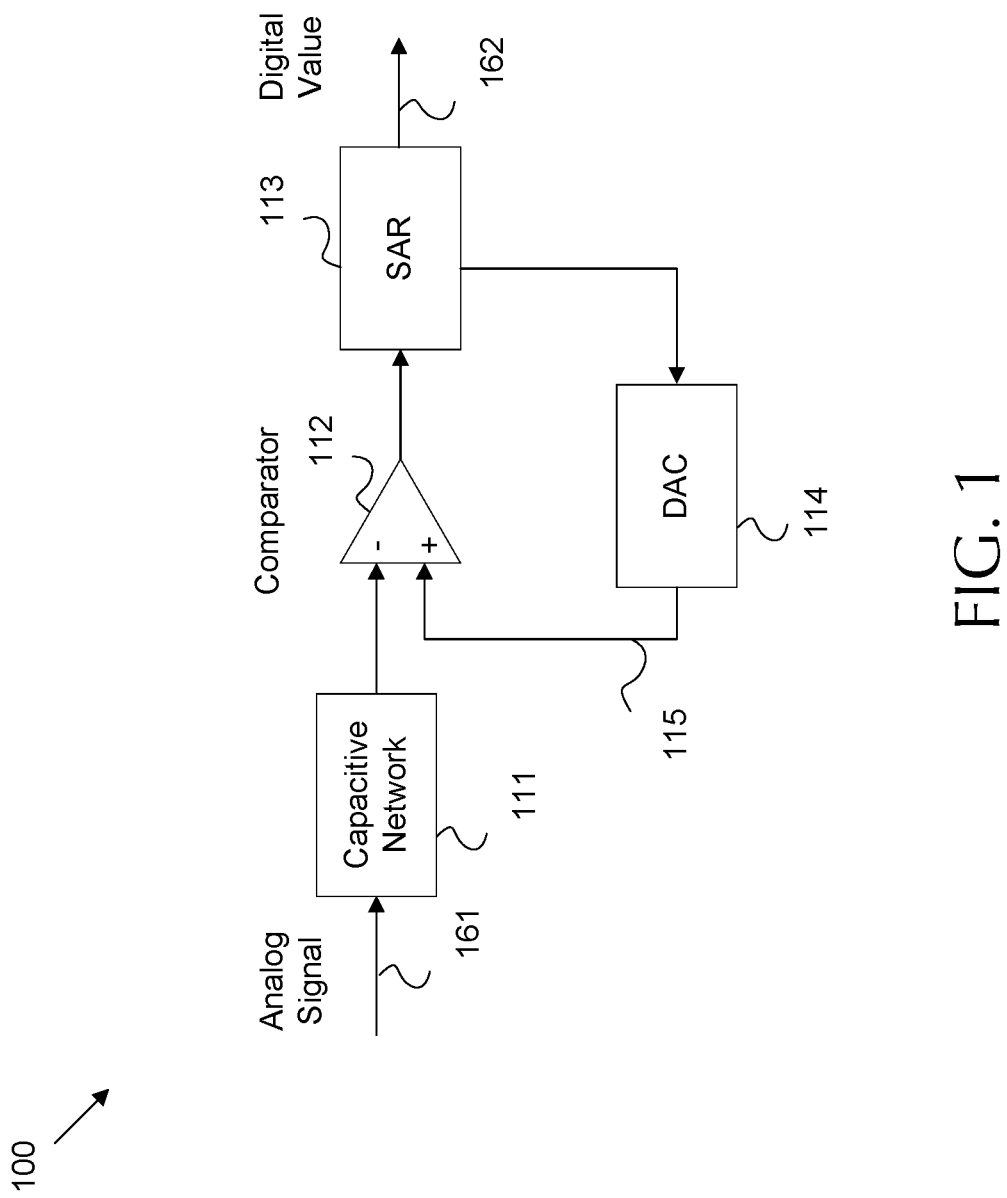
FIG. 1 is a schematic diagram of an example Successive Approximation Register (SAR) Analog to Digital Converter (ADC) architecture.

As noted above, electrical disturbances may alter the operation of ADC systems. For example, a SAR ADC employs an array of capacitors to sample an analog signal. The SAR ADC successively approximates the sample by comparing the amount of charge stored on successive capacitors to reference connection(s). Some SAR ADCs also invert the charge values by connecting a capacitor to a negative reference connection. This allows values to be subtracted during certain operations. Charge injection associated with switching and charge movement associated with charging and/or discharging a capacitor can result in significant electrical disturbance across the reference connection. Further, the capacitors may be compared in sequence, with the largest capacitor (e.g. the most significant bit (MSB) capacitor) tested first and the smallest capacitor (e.g. the least significant bit (LSB) capacitor) tested last. Accordingly, the charge movement associated with the larger capacitors may also have an outsized effect on accuracy during determination of values stored on the subsequent smaller capacitors. In other words, the larger capacitors alter the current provided by the reference connection, which renders the reference connection temporarily unstable for comparison purposes, and hence increases the likelihood of noise related measurement errors for subsequent smaller capacitors.

Disclosed herein is a SAR ADC designed to mitigate electrical disturbances associated with reference connections to a sampling capacitor network. The SAR ADC provides at least a fine reference connection and a rough reference connection to the capacitor network. Capacitors are connected to the rough reference connection and compared by a comparator to determine a digital bit. Once the comparison is complete, the capacitor is coupled to the fine reference. This scheme causes the electrical disturbances during comparison to be largely contained on the rough reference connection, while maintaining a low noise fine reference connection. Further, this scheme effectively disconnects the larger capacitors from the circuit containing the smaller capacitors while the smaller capacitors are being compared. For SAR ADCs that employ a negative reference, a negative fine reference connection and a negative rough reference connection are also employed in a similar manner. Electrical disturbances can be further mitigated if groups of capacitors are swapped to the fine reference at the same time. For example, a group of capacitors of specified size (e.g. four MSB capacitors) may be switched to the fine reference connection during comparison of the next capacitor (e.g. the fifth capacitor). This approach gives the larger capacitors more time to settle and hence moves less disturbance to the fine reference line. As a further example, a group of the smallest capacitors (e.g. four LSB capacitors) may never be switched to the fine reference to reduce charge injection related disturbances caused by switching. While the optimal scheme may vary between different capacitor network examples, employing the fine reference connection and the rough reference connection, as discussed herein, results in a significant decrease in comparison error without requiring the SAR ADC to delay comparisons to await dissipation of the electrical disturbances.

FIG. 1 is a schematic diagram of an example SAR ADC 100 architecture. The SAR ADC 100 includes a capacitive network 111, a comparator 112, a SAR 113, and a Digital to Analog Converter (DAC) 114 coupled as illustrated. The capacitive network 111 is coupled to an incoming analog signal 161. The capacitive network 111 includes a plurality of capacitors of varying levels of capacitance. The capacitors store charge from the analog signal 161 as a sample of the analog signal at a discrete instance in time. The SAR 113 may include a register for storing digital data as well as a circuit for providing known reference values. The DAC 114 is any device capable of converting a digital value to a corresponding analog signal value. The SAR 113 is configured to forward a known reference value (e.g. a one, a zero, etc.) via the DAC 114 to the comparator 112 for each bit of the sample. The reference values are communicated to the comparator over a reference connection 115. The comparator 112 is any electronic device capable of comparing two voltages and outputting an indication of which voltage is larger. The comparator 112 receives both voltage from the sample in the capacitive network 111 and the known value from the SAR 113 via the DAC 114. The comparator 112 then indicates which value is larger. The result of the comparison is stored in the SAR 113 as a bit of a corresponding digital value 162.

As such, the capacitive network 111 may include an array of capacitors for storing a portion of the analog signal for each bit desired in the digital value 162. The SAR ADC 100 may then iteratively test the electrical charge from the capacitors in the capacitive network 111 against the known value from the SAR 113 on a bit by bit basis. The results are stored in the SAR 113. Once all the desired bits have been tested, the resulting digital value 162 may be forwarded from the SAR ADC 100 for further use by coupled systems.

While an SAR ADC 100 may be implemented in many different fashions, it should be noted that the capacitive network 111 and the DAC 114 may be implemented in a common capacitor network. In such a case, the reference connection 115 may be acted upon by the capacitive network 111 resulting in electrical disturbance on the reference connection 115. As such, a first capacitor in the capacitive network 111 can generate noise on the reference connection 115, and hence alter the comparison by the comparator 112 when considering a subsequent reference value against a subsequent sample from a subsequent capacitor.

Figure 2:
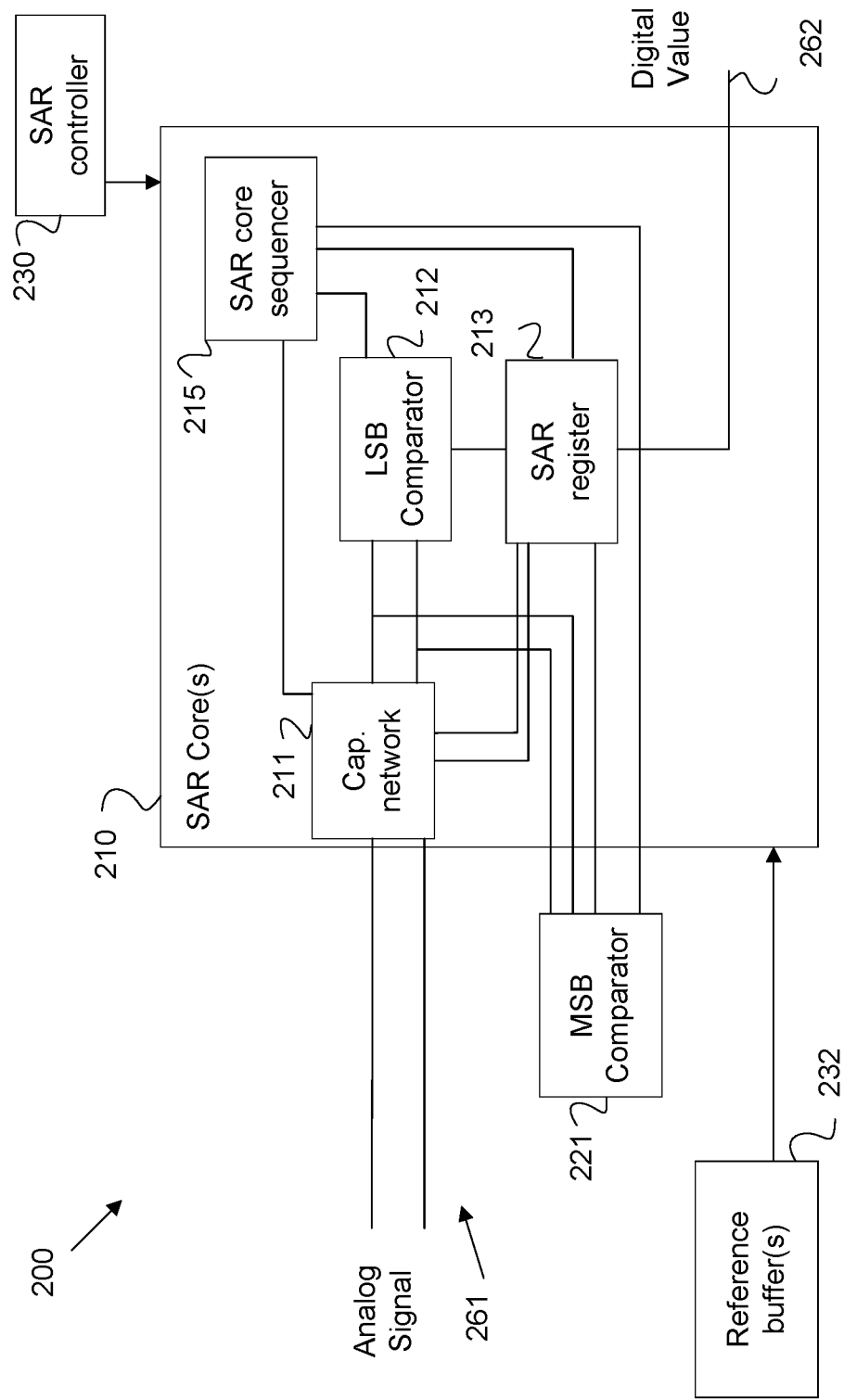
FIG. 2 is a schematic diagram of an example SAR core network.

FIG. 2 is a schematic diagram of an example SAR core network 200, which may be employed to implement a SAR ADC architecture, such as SAR ADC 100 architecture. The SAR core network 200 may comprise at least one SAR core 210, but may also employ a plurality of SAR cores 210 in some examples. The SAR cores 210 receive and samples an analog signal 261 and outputs corresponding digital value(s) 262. In some examples, the analog signal 261 is received as a differential signal, where a differential signal is a pair of complementary signals employed together to express signal values.

The SAR core network 200 contains a capacitive network 211 in each SAR core 210 for sampling. The capacitive network 211 may be substantially similar to capacitive network 111, DAC 114, or combinations thereof. The capacitive network 211 may take a sample of the analog signal 261 and store the sample for approximation as a digital value 262. The capacitive network 211 may be referred to as a sample and hold circuit. The capacitive network 211 is coupled to both a fine reference connection and a rough reference from the SAR register 213, which is discussed in more detail in reference to the figures below.

Once the analog signal 361 has been sampled by the capacitive network 311, the SAR cores 210 employ comparators to approximate digital values 262 based on the analog signal 261 samples via successive comparison. For example, each SAR core 210 may contain a LSB comparator 212 and may be coupled to a MSB comparator 221. The LSB comparator 212 and the MSB comparator 221 may be substantially similar to comparator 112. For example, the comparators 212 and 221 may each contain internal preamplifiers and a latch, which can be activated to make a comparison between inputs. In some examples, the MSB comparator 221 determines a most significant bit for each digital value 262. The LSB comparator 212 then determines the remaining least significant bits. The MSB comparator 221 may be shared between multiple SAR cores 210 in some examples. The MSB comparator 221 is subject to more significant signal swings than the LSB comparator 212 because a switch of the first digit may cause twice the signal swing of a next digit (e.g. the most significant LSB). Signal swings may result in leakage current in attendance system circuits. Large signal swings may amplify such leakage currents, which may result in distortion and/or increased power usage. As such, the MSB comparator 221 selects the MSBs outside of the SAR core(s) 210 to mitigate signal swings and attendant leakage current.

The SAR core 210 may also include a SAR register 213, which may be substantially similar to SAR 113. The SAR core 210 may operate by accepting a sample of the analog signal at the capacitive network 211, which may also include a DAC. The most significant bit of the sample is forwarded from the capacitive network 211 to the MSB comparator 221 and compared to a reference value from the SAR register 213 and/or the DAC in the capacitive network 211. The result is stored in the SAR register 213. Such process is then repeated for each successive LSB at the LSB comparator 221, with the results stored in the SAR register 213 as an approximated digital value 262. It should be noted that in some examples, the charge capacity of some of the capacitors of the capacitive network 211 may exceed the capacity of the comparators to measure directly. However, such capacitors can be measured by taking the difference between various capacitors. Accordingly, certain capacitors are inverted to a negative charge during the computation process by coupling the capacitors to a negative reference. The results may then be stored as a vector for normalization by other components.

The SAR core 210 may include a SAR core sequencer 215, which may be a control circuit configured to control the components of a SAR core 210 in order to enact the sampling and successive approximation sequence. For example, the SAR core sequencer 215 may manage the duty cycle for the SAR core 210 by sending command pulses to the SAR core 210 components for each clock cycle according to a finite state machine. The SAR core 210 may be implemented as any form of control processor, for example as an Application Specific Integrated Circuit (ASIC), a Field Programmable Gate Array (FPGA), a Digital Signal Processor (DSP), a general purpose processor, and/or any other control circuit. The SAR core network 200 may also include a SAR controller 230. The SAR controller 230 may be similar to the SAR sequencer 215, but may be employed to manage multiple SAR cores 210. For example, the SAR controller 230 may control each SAR sequencer 215, and hence may be employed to sequence the operations of multiple SAR cores 210 in parallel to generate a stream of digital values interleaved from the various cores as a digital signal.

The SAR core network 200 may also include various references buffers 231. The reference buffers 232 provides charge to generate reference values to be employed by the comparators 212 and 221 when determining digital values 262 based on analog signal 261 samples. As noted above, during the comparison process the capacitors of the capacitance network 211 may be repeatedly switched and inverted, and the resulting charge compared to determine the digital value. The capacitors may draw charge from the reference buffers 232 during this process. Such charge movement and switching disturbs the charge levels from the reference buffers 232, which may result in an inaccurate reference and a correspondingly inaccurate result. Accordingly, the reference buffers 232 are employed to provide both a fine reference connection and a rough reference connection to mitigate such disturbances as discussed in reference to the figures below.

Figure 3:
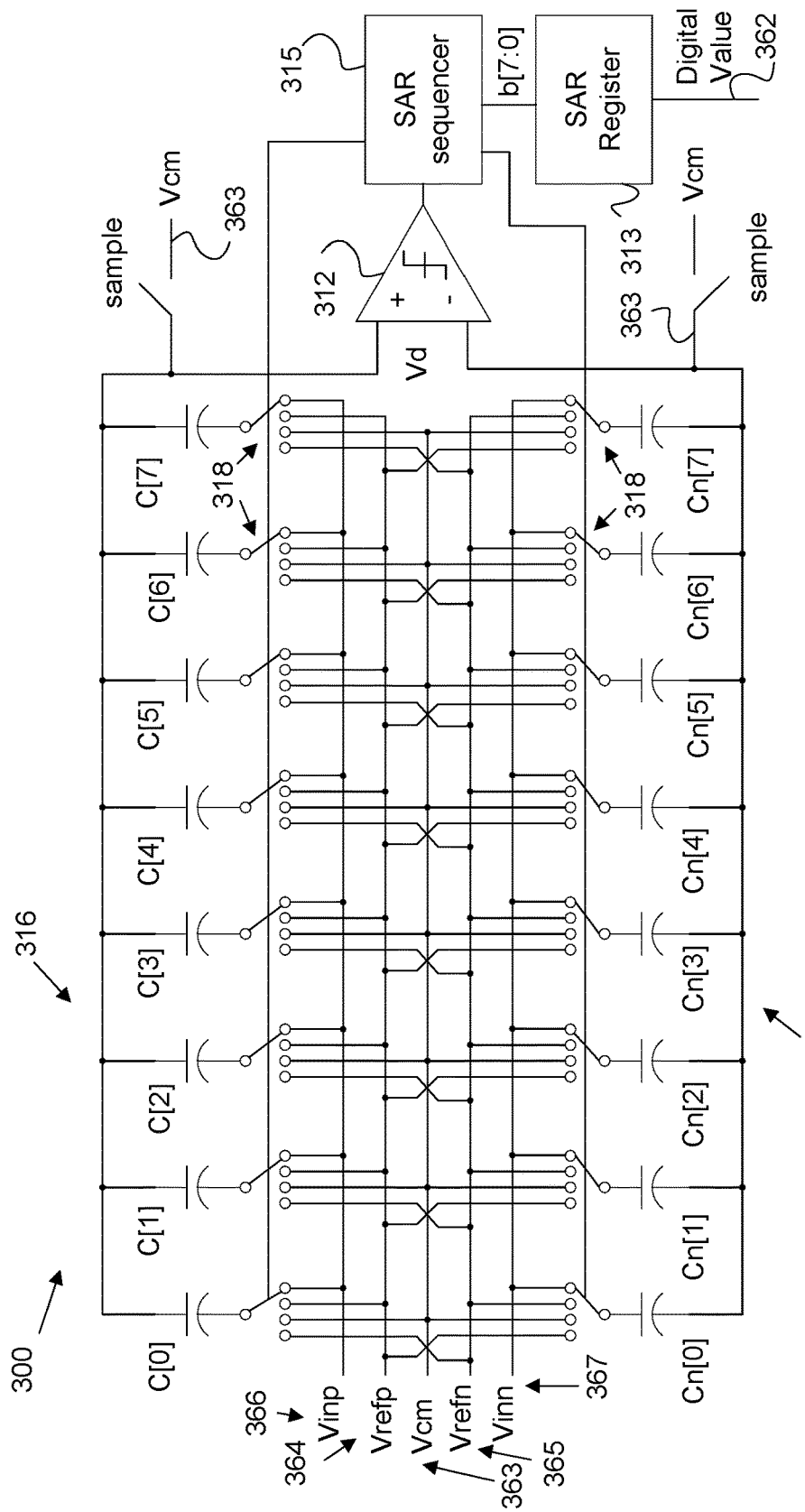
FIG. 3 is a schematic diagram of an example capacitor network for a SAR ADC.

FIG. 3 is a schematic diagram of an example capacitor network 300 for a SAR ADC. For example, the capacitor network 300 may be employed to implement capacitive networks 111 and/or 211. In a SAR ADC, the accuracy of comparator decisions for each bit directly depends on the accuracy of reference voltage. In switched capacitor implementations, disturbance of reference is occurs because the number of capacitors connected to reference connection is constantly changing based on comparator decisions. The capacitor network 300 depicts an example of a SAR capacitor network that employs a balance ternary encoding architecture. The network 300 includes capacitors 316 coupled to a comparator 312 via switches 318. The comparator 312 may implement a MSB comparator 221, a LSB comparator 212, or combinations thereof. The switches 318 are controlled by a SAR sequencer 315, which may implement a SAR core sequencer 215, a SAR controller 230, or combinations thereof. The results of the comparator 312 may pass through the SAR sequencer 315 for communication to the SAR register 313 for output as digital values 362, which may be substantially similar to SAR register 213 and digital values 262, respectively. The capacitor network 300 receives a common mode reference voltage (Vcm) 363, a positive input voltage (Vinp) 366, a negative input voltage (Vinn) 367, a positive reference voltage (Vrefp) 364, and a negative reference voltage (Vrefn) 365. The capacitors 316 are charged by a differential analog signal received over Vinp 366 and Vinn 367 until a sample is captured. Vcm 363 provides a nominal voltage (e.g. representing a zero value), Vrefp 364 provides a positive voltage (e.g. representing a value of positive one), and Vrefn 365 provides a negative voltage (e.g. representing a value of negative one). Capacitors 316 can be switched to Vcm 363 to determine an actual value or switched to Vrefp 364 and/or Vrefn 365 as desired to invert charge values to support subtraction operations.

The capacitors 316 may be coupled directly to the comparator 312. Before the comparator 312 makes decision for a bit value, the bottom plates of capacitors 316 corresponding to that bit are connected to a common mode reference (Vcm) 363. For purposes of clarity, it should be noted that the bottom plates are the capacitor 316 plates coupled to the switches 318 and top plates are capacitor 316 plates coupled to the comparator 312. After the decision of a particular bit is made, the bottom plates of the capacitors corresponding to the decision bit are switched from Vcm 363 to reference Vrefp 364 and Vrefn 365, respectively. Charge flow from reference to the capacitor 316 arrays perturb reference lines. Further, the operation of the switches 318 inject charge into the connections, which further perturb the reference lines.

Capacitors 316 corresponding to other previously determined bits may already be connected to the reference lines. Hence, capacitor network 300 must wait until references Vrefp 364 and Vrefn 365 return to their quiescent values from disturbances before the next bit decision is made. Otherwise, such disturbances may result in erroneous decisions by the comparator 312. By delaying in this manner, the capacitor network 300 is limited to either a lower conversion speed or a smaller settling time constant. It should also be noted that reference settling time constants cannot be reduced arbitrarily, as such reduction may cause the system to suffer from large thermal noise and charge injection error from over-sized switches.

Figure 4:
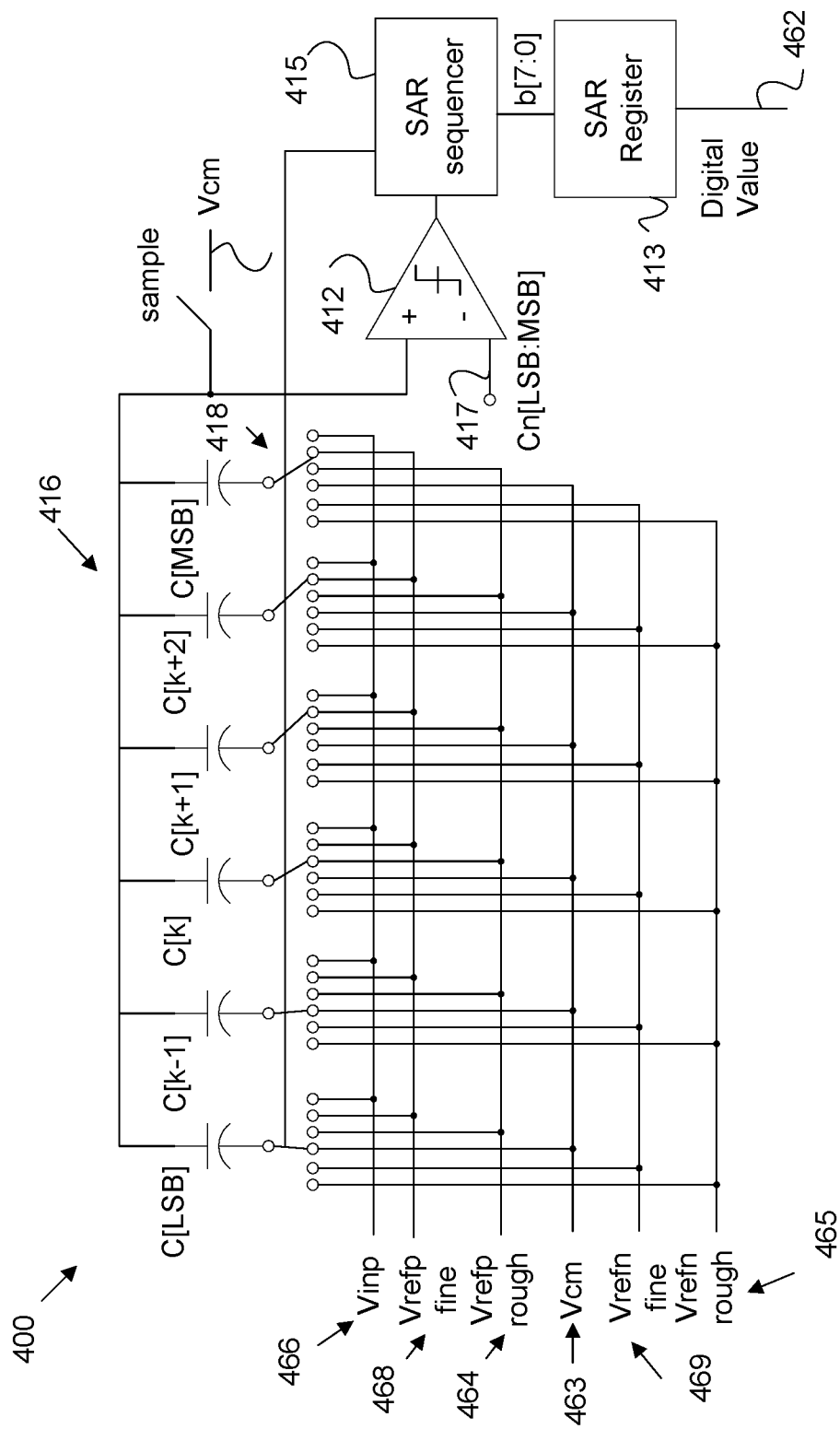
FIG. 4 is a schematic diagram of an example capacitor network with fine and rough reference lines.

FIG. 4 is a schematic diagram of an example capacitor network 400 with fine and rough reference lines. For example, the capacitor network 400 may be employed to implement capacitive networks 111 and/or 211 in a SAR ADC. The capacitor network 400 includes a comparator 412 with an input coupled to an array of capacitors 416 and 417 (e.g. capacitor array(s)). The output of the comparator 412 is coupled to a SAR sequencer 415, which is coupled to a SAR register 413 that outputs digital values 462. Such items may be similar to MSB comparator 221/LSB comparator 212, SAR core sequencer 215/SAR controller 230, SAR register 213, and digital values 262, respectively. The SAR sequencer 415 controls an array of switches 418, which couple the bottom plates of the capacitors 416 and/or 417 to inputs as desired. It should be noted that only the positive capacitors 416 are depicted for purposes of visual clarity. However, negative/reference capacitors 417 (e.g. coupled to the bottom input of the comparator 412) may be coupled to inputs via switches 418 in a manner similar to capacitors 416.

The capacitor network 400 includes a Vcm 463 connection, a Vinp 466 connection, a rough positive reference voltage (Vrefp rough) 464 connection, and a rough negative reference voltage (Vrefn rough) 465 connection, which are substantially similar to Vcm 363, Vinp 366, Vrefp 364, and Vrefn 365, respectively. The capacitor network 400 may also include a Vinn connection (not shown) for capacitors 417. The capacitor network 400 also includes a fine positive reference voltage (Vrefp fine) 468 connection and a fine negative reference voltage (Vrefn fine) 469 connection. Vrefp fine 468 and Vrefn fine 469 are substantially similar to Vrefp rough 464 and Vrefn rough 465, respectively, but are segregated to create a low noise environment. Hence, the fine reference connection may include a fine positive reference connection Vrefp fine 468 and/or a fine negative reference connection Vrefn fine 469. Further, the rough reference connection may include a rough positive reference connection Vrefp 364 and/or a rough negative reference connection Vrefn rough 465.

The capacitors 416 include a MSB capacitor, a LSB capacitor, and a number of intermediate bit capacitors. The MSB capacitor 416 is the largest capacitor and holds the most charge, with each successive capacitor 416 holding less charge until the LSB capacitor 416 (e.g. the smallest capacitor with the smallest charge capacity). Any number of capacitors 416 may be used depending on the desired number of bits for the digital value 462. The capacitors 416 are depicted in terms of k, where k indicates a current bit capacitor 416 being compared, k+1 indicates a previously compared bit capacitor 416, k−1 indicates a next bit capacitor 416 to be compared, etc.

In one example, the SAR sequencer 415 is configured to activate the switch 418 array to couple the current bit capacitor 416 being compared to Vrefp rough 464 or Vrefn rough 465, as desired. Once the bit for the current bit capacitor 416 is determined, the current bit capacitor 416 is coupled to Vrefp fine 468 or Vrefn fine 469, as desired, and the next bit capacitor 416 is coupled to Vrefp rough 464 or Vrefn rough 465, as desired. In other words, the SAR sequencer 415 activates the switch 418 array to couple the current bit capacitor 416 of the capacitor array to the corresponding rough reference connection while a current bit corresponding to the current bit capacitor is determined by the comparator 412. Further, the SAR sequencer 415 activates the switch array to couple a previous bit capacitor 416 of the capacitor array to the corresponding fine reference connection while the current bit capacitor 416 is coupled to the corresponding rough reference connection. Stated yet another way, at any SAR cycle, capacitors 416 k+ are coupled to Vrefp fine 468 or Vrefn fine 469, capacitor 416 k is coupled to Vrefp rough 464 or Vrefn rough 465 for comparison, and capacitors 416 k− are coupled to Vcm 463 awaiting comparison.

The abovementioned approach ensures that the switching activity and charge movement for the current capacitor 416 is contained in the rough reference connections during comparison. Once the charge has settled into a steady state, the current capacitor is moved to the fine reference connections, and hence does not disturb the charge across the fine reference connections. While both the rough reference connections and the fine reference connections may be derived from the same reference buffer, a low output impedance of the reference buffer may absorb the disturbance from rough reference connections, and therefore the fine reference connections remain quiet. In this example, only the bottom plate of capacitor 416 k is attached to rough reference and the rest of the capacitors 416 are not perturbed. In the case that the disturbance has not settled due to a fast SAR clock rate, the error introduced to the decision of bit b[k−1] (e.g. the next bit) is attenuated by the weight of capacitance of capacitor 416 k (which is larger than capacitor 416 k−1). In other words, the capacitors 416 of the capacitor array are coupled to the fine reference, Vrefp fine 468 or Vrefn fine 469, to avoid charge related disturbances associated with charge flow occurring across the rough connection, Vrefp rough 464 or Vrefn rough 465, during bit determinization by the comparator 412. This allows the SAR ADC to employ a higher SAR clock rate and avoid decision errors due to unsettled reference disturbances.

An advantage of reference disturbance mitigation mechanism discussed above may support a non-binary weighted SAR architecture, because a decision error tolerance due to bit radix is less than 2. For example, when the radix between an adjacent bit is R, or $C_{k+1}/C_k=R$, then $C_k=R^k C_0$ where $C_0$ is the LSB capacitance, $C_{k+1}$ is the capacitance of capacitor k+1, $C_k$ is the capacitance of capacitor k, etc. Error tolerance of bit k−1, denoted as b[k−1] is described by equation 1:

$$E_{k-1} = \frac{R^{k-1} + R - 2}{R^n - 1},$$ Equation 1 where $E_{k-1}$ is the error tolerance of bit k−1, R is the radix of corresponding bits as denoted by superscript, and n is a desired number of digital bits in the digital value. Further, the bit weight of bit k, denoted as b[k], is described by equation 2:

$$W_k = \frac{R^k(R - 1)}{R^n - 1},$$ Equation 2 where $W_k$ is the bit weight of bit k and other variables are as discussed above. Further, equation 2 employs a 0 decibel relative to full scale (dBFS) signal normalized to unit. As mentioned above, the decision error for b[k−1] due to unsettled disturbance error from decision of b[k] is attenuated by a factor of Wk when the rough/fine reference scheme discussed above is employed. As long as the attenuated error is less than decision error tolerance $E_k$, the reference line disturbance does not lead to a conversion error since the decision error for bit[k] can be recovered by bit[k−1:0] decisions later. A numerical example below shows the advantage of rough/fine reference scheme discussed above by comparing the case where a single reference line is employed as discussed with respect to FIG. 3.

In the case where a single reference line is used, bottom plates of all capacitors from the MSB capacitor to capacitor k (e.g. all capacitors from which decisions have been made) are connected to reference line. Therefore disturbance error due to decision of b[k] is attenuated by according to equation 3:

$$W_{k:MSB} = \sum_{i=k}^{n-1} W_i = \frac{R^n - R^k}{R^n - 1},$$ Equation 3 where $W_{kSME}$ is the bit weight of all bits MSB to k and all other variables are as discussed above. Such an attenuation factor quickly approaches unit after about two to four MSB decisions are made. In other words, the settling error in the single reference line is no longer attenuated after about four MSB decisions and any error is directly carried to decisions of lower bits. However, employing both a fine reference line and a rough reference line, as discussed with respect to FIG. 4, overcomes such error. The difference in error between the two schemes is discussed further below with respect to FIG. 6 below.

As another example, the SAR sequencer 415 may be optimized for certain networks by delaying the time when the encoded MSB capacitors are switched from the rough reference line (e.g. Vrefp rough 464 or Vrefn rough 469) to the fine reference line (e.g. Vrefp fine 468 or Vrefn fine 469). In other words, instead of switching a capacitor 416 of an encoded bit from the rough reference to fine reference at the next cycle following a decision cycle, several MSBs, e.g., 4 MSBs may be kept on a rough reference line until a threshold of decisions are made (e.g. the 5th MSB decision). When the bottom plate of the threshold bit capacitor (e.g. the 5th MSB capacitor) is switched from Vcm 463 to the rough reference line at decision point, the bottom plates of all 4 MSB capacitors are switched from rough reference line to fine reference line together. In other words, coupling the previous bit capacitor C[k+1] to the fine reference connection (e.g. Vrefp fine 468 or Vrefn fine 469) includes simultaneously coupling a group of previous bit capacitors C[k+1:MSB] while the current bit capacitor C[k] is coupled to the rough reference connection (e.g. Vrefp rough 464 or Vrefn rough 469). It should be noted that the group of previous bit capacitors includes the MSB capacitor The group also includes a specified number of largest capacitors 416 in the capacitor array.

The advantage of this mechanism is to reduce the settling error of the MSB capacitors 416 that propagates from rough reference line to fine reference line, since extra settling time is given to MSB capacitors. This mechanism presumes that the decision error from the unsettled rough reference does not exceed the decision error tolerance of any bit in the group of the MSBs that are postponed to switch from rough reference line to fine reference line. This is often the case for four to six MSBs in an example SAR system. Because of this mechanism, accuracy of the fine reference line is improved significantly, which is useful in systems where the fine reference line is shared by multiple cores and/or shared by multiple channels that employ high linearity.

As another example, the SAR sequencer 415 may be optimized for certain networks by modifying the mechanism for the LSB capacitors 416. Because capacitance weight decreases exponentially from MSB to LSB, reference disturbance is greatly attenuated from bottom plates of LSB capacitors to the common top plate of the capacitor array in FIG. 4. This implies that the disturbances of the rough reference line can be ignored for some LSB decisions as long as the attenuated unsettled disturbance shown on top plate is below decision error tolerance for the corresponding LSB bits. In other words, some LSB capacitors 416 can remain on the rough reference line (e.g. Vrefp rough 464 or Vrefn rough 469) after the corresponding decisions are made without being switched to fine reference line (e.g. Vrefp fine 468 or Vrefn fine 469). By keeping the last four to six LSB capacitors 416 on the rough reference line(s), the decision error from unsettled reference disturbances remain below the quantization noise floor. This mechanism further reduces the disturbance to the fine reference line(s) since the fine reference line experiences fewer switching activities. It is worth noting that although the capacitance weight is small for LSBs as viewed from top plate, the actual capacitive load to the corresponding reference line may not be small due to bottom plate parasitic capacitances. This issue is of particular note when certain chip area saving SAR structures are employed. In other words, the SAR sequencer 415 may not cause the switch 418 array to couple a LSB capacitor 416 to the fine reference (e.g. Vrefp fine 468 or Vrefn fine 469) in some cases. Further, the SAR sequencer 415 may not cause the switch 418 array to couple a specified number of smallest capacitors 416 to the fine reference (e.g. Vrefp fine 468 or Vrefn fine 469).

It should be noted that the examples discussed above may be employed together. For example, a specified number of MSB capacitors may remain on the rough reference line to settle and then be switched simultaneously. Then intermediate bit capacitors may each switch to the fine reference in the cycle immediately following their comparison. Finally, a specified number of LSB capacitors then remain on the rough reference line after comparison.

It should also be noted that the abovementioned mechanisms may be employed in a multi-core architecture. For example, a fine reference line may be shared by multiple SAR cores and even multiple channels. In such architectures, several SAR cores are interleaved in the time domain. If a single reference line is used, the disturbance to reference lines due to MSB decisions of one core may directly propagate to another core where LSB decisions are being made. This may occur through MSB capacitors of the latter core without much attenuation. This may result in errors in cases of unsettled disturbance when the SAR clock rate is high. However by employing the rough/fine reference scheme of FIG. 4, only one capacitor from each core attached to rough reference line at any time in some examples. As long as the attenuated unsettled disturbance is smaller than the error tolerance of the next decision of each core, the rough reference line can be shared by all cores. If a number of cores are large and the collective disturbance is too large to be attenuated within error tolerance of a core, more than one rough reference line can be used. In this scheme, the fine reference can be shared by all cores since the fine reference is relatively quiet (e.g. without reference disturbances). This reference scheme can increase ADC sample rate substantially. In other words, the current bit capacitor may be positioned on a first SAR ADC core while the previous bit capacitor may be positioned on second/separate SAR ADC core. In such a case, the SAR sequencer 415 may be acting as a multi-core SAR controller, such as SAR controller 230. For examples, an MSB comparator may consider capacitor networks from multiple cores, and the capacitor networks may share reference lines. In such a case, a capacitor from a first core may disturb the reference line and affect the decision of a separate conversion occurring on another core. The mechanisms disclosed above may also mitigate disturbances in such a scenario as well.

Figure 5:
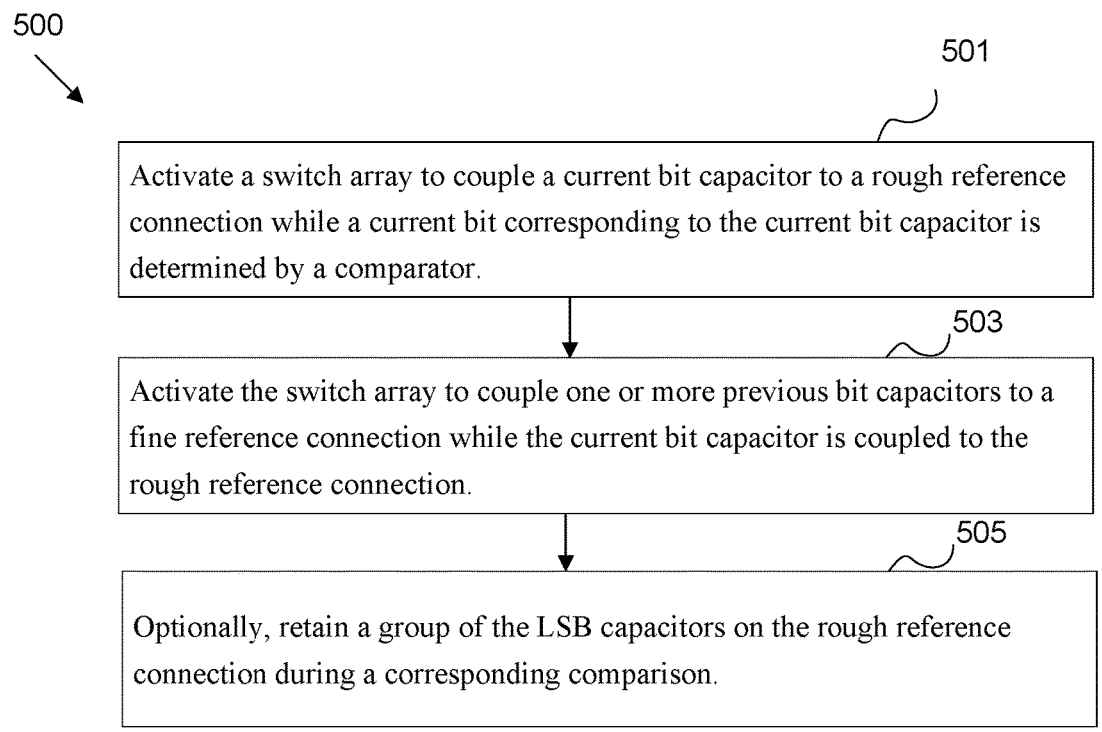
FIG. 5 is a flowchart of an example method of operating a capacitor network with fine and rough reference lines.

FIG. 5 is a flowchart of an example method 500 of operating a capacitor network, such as capacitor network 400, with fine and rough reference lines operating on a SAR ADC, such as SAR core network 200. At block 501, a switch array in a SAR ADC is activated to couple a current bit capacitor of a capacitor array to a rough reference connection. The current bit capacitor is coupled to the rough reference connection while a current bit corresponding to the current bit capacitor is determined by a comparator.

At block 503, the switch array is activated to couple a previous bit capacitor of the capacitor array to a fine reference connection while the current bit capacitor is coupled to the rough reference connection. It should be noted that coupling the previous bit capacitor to the fine reference connection in block 503 may include simultaneously coupling a group of previous bit capacitors while the current bit capacitor is coupled to the rough reference connection. For example the group of previous bit capacitors may include an MSB capacitor and/or a specified number of largest capacitors in the capacitor array in some examples. Also, as noted above, the fine reference connection of block 503 may include a fine positive reference connection, a fine negative reference connection, or combinations thereof, in some examples. Further, the rough reference connection of blocks 501 and 503 may include a rough positive reference connection, a rough negative reference connection, or combinations thereof, in some examples. Also, the current bit capacitor and the previous bit capacitor may be positioned on separate SAR ADC cores in some cases. Regardless of the particular example, the capacitors of the capacitor array are coupled to the fine reference to avoid charge related disturbances associated with charge flow occurring across the rough connection during bit determinization by the comparator.

Optionally, at block 505, a group of the LSB capacitors may be retained on the rough reference during the comparison of corresponding LSB bits. In such a case, the switch array does not couple the LSB capacitor to the fine reference, and the switch array may also not couple a specified number of smallest capacitors to the fine reference. As noted above, the smaller capacitors may cause disturbances that are below the noise floor, and hence switching them to the fine reference may be unnecessary.

Figure 6:
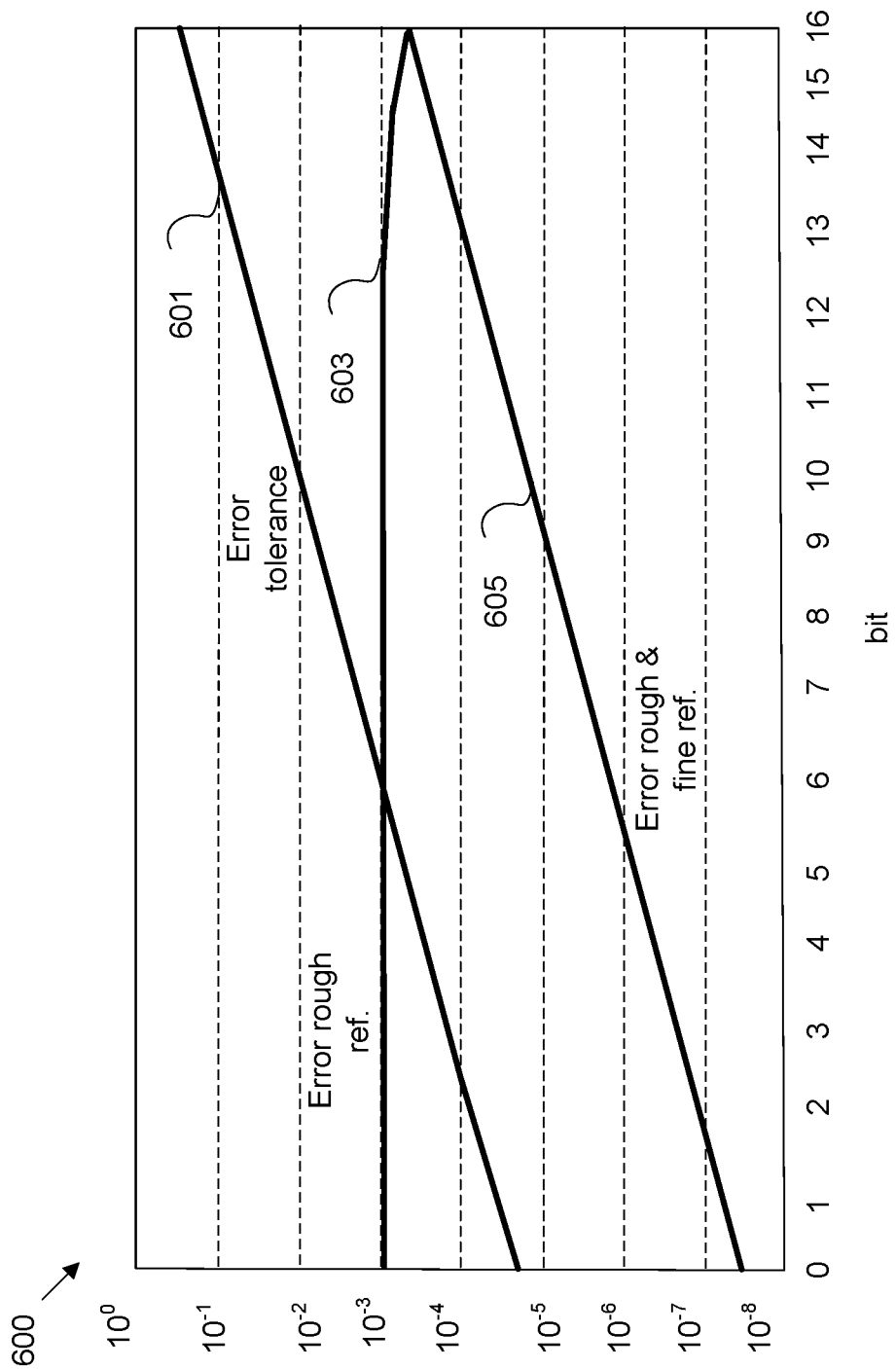
FIG. 6 is a graph of an example reference disturbance in a SAR ADC capacitor network.

FIG. 6 is a graph 600 of an example reference disturbance in a SAR ADC capacitor network, such as a capacitive network in a SAR core 210. Specifically, the graph 600 depicts error tolerance 601 of the SAR ADC. The graph 600 also depicts reference disturbance related error 603 for a capacitive network with only a rough reference connection (e.g. capacitor network 300) and reference disturbance related error 605 for a capacitive network with both a rough reference connection and a fine reference connection (e.g. capacitor network 400). The graph 600 depicts the error tolerance and error in terms of reference current disturbance in decibels on the vertical axis versus capacitor bit decision on the horizontal axis, where bit zero is the MSB and bit sixteen is the LSB.

The curves of graph 600 are determined for an 18-bit (e.g. n=18) SAR with radix R=1.8. Settling error is not constant from MSB to LSB, due in part to parasitic capacitance at the bottom plates and finite switch sizes. However, there may be a minimum disturbance in a SAR system. In the example of graph 600, a 1 millivolt (mV) settling error due to reference line disturbance is employed for illustration purposes.

As shown, the bit decision error tolerance 601 for this example is the lowest for MSBs and increases for LSBs as errors may be cumulative. The disturbance error 603 without the fine reference connection exceeds the error tolerance 601 for the first six bits, rendering the results erroneous in this example. Specifically, the MSB decision the tolerance is lower for MSB because fewer capacitors are connected to reference line, and because MSB capacitors have relatively larger error tolerances. Hence, reference line disturbance does not cause problems for decisions since reference disturbance introduced decision error does not exceed error tolerances of decision bit. However, as the SAR process continues towards to LSBs, disturbance introduced decision errors exceed error tolerances of decision bits and/or decision errors can no longer be recovered by decisions of lower bits. This results in a conversion error.

In contrast, the disturbance error 605 for a system with both a fine reference and a rough reference remains more than two orders of magnitude below the error tolerance 601. This indicates that with the rough/fine reference scheme described above, reference disturbance no longer causes erroneous decisions for the lower bits.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes a Successive Approximation Register (SAR) Analog to Digital Converter (ADC) comprising: a comparator; a capacitor array coupled to an input of the comparator; a fine reference connection; a rough reference connection; a switch array; and a SAR sequencer configured to: activate the switch array to couple a current bit capacitor of the capacitor array to the rough reference connection while a current bit corresponding to the current bit capacitor is determined by the comparator; and activate the switch array to couple a previous bit capacitor of the capacitor array to the fine reference connection while the current bit capacitor is coupled to the rough reference connection.

Example 2 includes the SAR ADC of Example 1, wherein coupling the previous bit capacitor to the fine reference connection includes simultaneously coupling a group of previous bit capacitors while the current bit capacitor is coupled to the rough reference connection.

Example 3 includes the SAR ADC of any of Examples 1-2, wherein the group of previous bit capacitors includes a most significant bit (MSB) capacitor.

Example 4 includes the SAR ADC of any of Examples 1-3, wherein the group of previous bit capacitors includes a specified number of largest capacitors in the capacitor array.

Example 5 includes the SAR ADC of any of Examples 1-4, wherein the SAR sequencer does not cause the switch array to couple a least significant bit (LSB) capacitor to the fine reference.

Example 6 includes the SAR ADC of any of Examples 1-5, wherein the SAR sequencer does not cause the switch array to couple a specified number of smallest capacitors to the fine reference.

Example 7 includes the SAR ADC of any of Examples 1-6, wherein the fine reference connection includes a fine positive reference connection, a fine negative reference connection, or combinations thereof.

Example 8 includes the SAR ADC of any of Examples 1-7, wherein the rough reference connection includes a rough positive reference connection, a rough negative reference connection, or combinations thereof.

Example 9 includes the SAR ADC of any of Examples 1-8, wherein the current bit capacitor and the previous bit capacitor are positioned on separate SAR ADC cores and the SAR sequencer is configured as a multi-core SAR controller.

Example 10 includes the SAR ADC of any of Examples 1-9, wherein capacitors of the capacitor array are coupled to the fine reference to avoid charge related disturbances associated with charge flow occurring across the rough connection during bit determinization by the comparator.

Example 11 includes a method comprising: activating, in a Successive Approximation Register (SAR) Analog to Digital Converter (ADC), a switch array to couple a current bit capacitor of a capacitor array to a rough reference connection while a current bit corresponding to the current bit capacitor is determined by a comparator; and activating the switch array to couple a previous bit capacitor of the capacitor array to a fine reference connection while the current bit capacitor is coupled to the rough reference connection.

Example 12 includes the method of Example 11, wherein coupling the previous bit capacitor to the fine reference connection includes simultaneously coupling a group of previous bit capacitors while the current bit capacitor is coupled to the rough reference connection.

Example 13 includes the method of any of Examples 11-12, wherein the group of previous bit capacitors includes a most significant bit (MSB) capacitor.

Example 14 includes the method of any of Examples 11-13, wherein the group of previous bit capacitors includes a specified number of largest capacitors in the capacitor array.

Example 15 includes the method of any of Examples 11-14, wherein the switch array does not couple a least significant bit (LSB) capacitor to the fine reference.

Example 16 includes the method of any of Examples 11-15, wherein the switch array does not couple a specified number of smallest capacitors to the fine reference.

Example 17 includes the method of any of Examples 11-16, wherein the fine reference connection includes a fine positive reference connection, a fine negative reference connection, or combinations thereof.

Example 18 includes the method of any of Examples 11-17, wherein the rough reference connection includes a rough positive reference connection, a rough negative reference connection, or combinations thereof.

Example 19 includes the method of any of Examples 11-18, wherein the current bit capacitor and the previous bit capacitor are positioned on separate SAR ADC cores.

Example 20 includes the method of any of Examples 11-19, wherein capacitors of the capacitor array are coupled to the fine reference to avoid charge related disturbances associated with charge flow occurring across the rough connection during bit determinization by the comparator.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A Successive Approximation Register (SAR) Analog to Digital Converter (ADC) comprising:
   a comparator;
   a capacitor array coupled to an input of the comparator;
   a fine reference connection;
   a rough reference connection;
   a switch array; and
   a SAR sequencer configured to:
      activate the switch array to couple a current bit capacitor of the capacitor array to the rough reference connection while a current bit corresponding to the current bit capacitor is determined by the comparator; and
      activate the switch array to couple a previous bit capacitor of the capacitor array to the fine reference connection while the current bit capacitor is coupled to the rough reference connection.

2. The SAR ADC of claim 1, wherein coupling the previous bit capacitor to the fine reference connection includes simultaneously coupling a group of previous bit capacitors while the current bit capacitor is coupled to the rough reference connection.

3. The SAR ADC of claim 2, wherein the group of previous bit capacitors includes a most significant bit (MSB) capacitor.

4. The SAR ADC of claim 2, wherein the group of previous bit capacitors includes a specified number of largest capacitors in the capacitor array.

5. The SAR ADC of claim 1, wherein the SAR sequencer does not cause the switch array to couple a least significant bit (LSB) capacitor to the fine reference.

6. The SAR ADC of claim 1, wherein the SAR sequencer does not cause the switch array to couple a specified number of smallest capacitors to the fine reference.

7. The SAR ADC of claim 1, wherein the fine reference connection includes a fine positive reference connection, a fine negative reference connection, or combinations thereof.

8. The SAR ADC of claim 1, wherein the rough reference connection includes a rough positive reference connection, a rough negative reference connection, or combinations thereof.

9. The SAR ADC of claim 1, wherein the current bit capacitor and the previous bit capacitor are positioned on separate SAR ADC cores and the SAR sequencer is configured as a multi-core SAR controller.

10. The SAR ADC of claim 1, wherein capacitors of the capacitor array are coupled to the fine reference to avoid charge related disturbances associated with charge flow occurring across the rough connection during bit determinization by the comparator.

11. A method comprising:
   activating, in a Successive Approximation Register (SAR) Analog to Digital Converter (ADC), a switch array to couple a current bit capacitor of a capacitor array to a rough reference connection while a current bit corresponding to the current bit capacitor is determined by a comparator; and
   activating the switch array to couple a previous bit capacitor of the capacitor array to a fine reference connection while the current bit capacitor is coupled to the rough reference connection.

12. The method of claim 11, wherein coupling the previous bit capacitor to the fine reference connection includes simultaneously coupling a group of previous bit capacitors while the current bit capacitor is coupled to the rough reference connection.

13. The method of claim 12, wherein the group of previous bit capacitors includes a most significant bit (MSB) capacitor.

14. The method of claim 12, wherein the group of previous bit capacitors includes a specified number of largest capacitors in the capacitor array.

15. The method of claim 11, wherein the switch array does not couple a least significant bit (LSB) capacitor to the fine reference.

16. The method of claim 11, wherein the switch array does not couple a specified number of smallest capacitors to the fine reference.

17. The method of claim 11, wherein the fine reference connection includes a fine positive reference connection, a fine negative reference connection, or combinations thereof.

18. The method of claim 11, wherein the rough reference connection includes a rough positive reference connection, a rough negative reference connection, or combinations thereof.

19. The method of claim 11, wherein the current bit capacitor and the previous bit capacitor are positioned on separate SAR ADC cores.

20. The method of claim 11, wherein capacitors of the capacitor array are coupled to the fine reference to avoid charge related disturbances associated with charge flow occurring across the rough connection during bit determinization by the comparator.

\* \* \* \* \*